US007932146B2

(12) United States Patent
Chen et al.

(10) Patent No.: US 7,932,146 B2
(45) Date of Patent: Apr. 26, 2011

(54) METAL GATE TRANSISTOR AND POLYSILICON RESISTOR AND METHOD FOR FABRICATING THE SAME

(75) Inventors: Yi-Wen Chen, Tainan County (TW); Li-Wei Cheng, Hsin-Chu (TW); Che-Hua Hsu, Hsin-Chu Hsien (TW); Chih-Hao Yu, Tainan County (TW); Cheng-Hsien Chou, Tainan (TW); Chien-Ming Lai, Tainan County (TW); Tian-Fu Chiang, Taipei (TW); Chien-Ting Lin, Hsin-Chu (TW); Guang-Hwa Ma, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 473 days.

(21) Appl. No.: 12/052,728

(22) Filed: Mar. 20, 2008

(65) Prior Publication Data

US 2009/0236669 A1 Sep. 24, 2009

(51) Int. Cl.
*H01L 21/8234* (2006.01)
*H01L 29/76* (2006.01)

(52) U.S. Cl. ........ 438/238; 438/155; 438/382; 257/379; 257/380; 257/538

(58) Field of Classification Search .................. 438/155, 438/229, 230, 238, 381, 382; 257/369, 379, 257/380, 381, 528, 536, 537, 538
See application file for complete search history.

(56) References Cited

U.S. PATENT DOCUMENTS

| | | | | |
|---|---|---|---|---|
| 5,141,597 A * | 8/1992 | Adams et al. | 438/384 |
| 6,207,543 B1 * | 3/2001 | Harvey et al. | 438/586 |
| 6,509,225 B2 * | 1/2003 | Moriwaki et al. | 438/241 |
| 6,768,174 B2 | 7/2004 | Hasegawa et al. | |
| 6,936,520 B2 | 8/2005 | Yamanoue et al. | |
| 2005/0191833 A1 * | 9/2005 | Chang et al. | 438/586 |
| 2007/0184600 A1 * | 8/2007 | Zhang et al. | 438/199 |
| 2009/0039433 A1 * | 2/2009 | Yang et al. | 257/365 |

FOREIGN PATENT DOCUMENTS

| | | |
|---|---|---|
| CN | 1409400 A | 4/2003 |
| CN | 1499577 A | 5/2004 |
| CN | 1277296 C | 9/2006 |
| JP | P200031291 A | 1/2000 |

* cited by examiner

*Primary Examiner* — Kevin M Picardat
(74) *Attorney, Agent, or Firm* — Winston Hsu; Scott Margo

(57) ABSTRACT

A method for fabricating metal gate transistors and a polysilicon resistor is disclosed. First, a substrate having a transistor region and a resistor region is provided. A polysilicon layer is then formed on the substrate to cover the transistor region and the resistor region of the substrate. Next, a portion of the polysilicon layer disposed in the resistor is removed, and the remaining polysilicon layer is patterned to create a step height between the surface of the polysilicon layer disposed in the transistor region and the surface of the polysilicon layer disposed in the resistor region.

19 Claims, 8 Drawing Sheets

METAL GATE TRANSISTOR AND POLYSILICON RESISTOR AND METHOD FOR FABRICATING THE SAME

BACKGROUND OF THE INVENTION

1. Field of the Invention

The invention relates to a method for fabricating a semiconductor device having a metal gate transistor and a polysilicon resistor, and more particularly, to a method for lowering the height of polysilicon resistor, such that the top of the polysilicon resistor is lower than the top of the metal gate transistor.

2. Description of the Prior Art

In the field of semiconductor fabrication, the use of polysilicon material is diverse. Having a strong resistance for heat, polysilicon materials are commonly used to fabricate gate electrodes for metal-oxide semiconductor transistors. The gate pattern fabricated by polysilicon materials is also used to form self-aligned source/drain regions as polysilicon readily blocks ions from entering the channel region.

However, devices fabricated by polysilicon still have many drawbacks. In contrast to most metal, polysilicon gates are fabricated by semiconductor materials having high resistance, which causes the polysilicon gate to work under a much lower rate than other metal gates. In order to compensate for slightly lowered rate of performance, a significant amount of silicides is applied during the fabrication of polysilicon processes, such that the performance of the device could be increased to an acceptable level.

Gate electrodes fabricated by polysilicon also causes a depletion effect. In most circumstances, the optimum doping concentration for polysilicon is between about $2\times20^{20}/cm^3$ and $3\times10^{20}/cm^3$. As most gate electrodes have a doping concentration of at least $5\times10^{21}/cm^3$, the limited doping concentration of polysilicon gates often results in a depletion region at the interface between the gate and the gate dielectric layer. This depletion region not only thickens the gate dielectric layer, but also lowers the capacitance of the gate, and ultimately reduces the driving ability of the device. In order to solve this problem, double work function metal gates are used to replace conventional polysilicon to fabricate gate electrodes for MOS transistors.

However, it is well known in the art that the degree of difficulty for fabricating a well-controlled double work function metal is immense as the process often involves complicated integration between NMOS device and PMOS device. The difficulty increases even more as the thickness and materials used in double work function metal gates requires a much more strict demand. Hence, how to successfully integrate the fabrication of a conventional double work function metal gate transistor with other passive devices including capacitors and resistors has become an important study in the field.

SUMMARY OF THE INVENTION

It is an objective of the present invention to provide a method for fabricating a semiconductor device having both metal gate transistor and polysilicon resistor.

According to a preferred embodiment of the present invention, a method for fabricating metal gate transistors and a polysilicon resistor is disclosed. The method includes the steps of: providing a substrate having a transistor region and a resistor region; forming a polysilicon layer on the substrate to cover the transistor region and the resistor region; removing a portion of the polysilicon layer disposed in the resistor region; and patterning the polysilicon layer, such that a step height is created between the surface of the polysilicon layer disposed in the transistor region and the surface of the polysilicon layer disposed in the resistor region.

According to another aspect of the present invention, a semiconductor device having metal gate transistor and polysilicon resistor is disclosed. The semiconductor device preferably includes: a substrate having a transistor region and a resistor region; a transistor disposed in the transistor region, in which the transistor includes a metal gate structure; and a polysilicon resistor structure disposed in the resistor region, in which the height of the polysilicon resistor structure is lower than the height of the metal gate structure.

Another aspect of the present invention discloses a semiconductor device having metal gate transistor and polysilicon resistor. The semiconductor device includes: a substrate having a transistor region and a resistor region; a transistor disposed in the transistor region, in which the transistor includes a truncated metal gate structure; and a polysilicon resistor structure disposed in the resistor region, in which the top of the polysilicon resistor structure is even with the top of the truncated metal gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
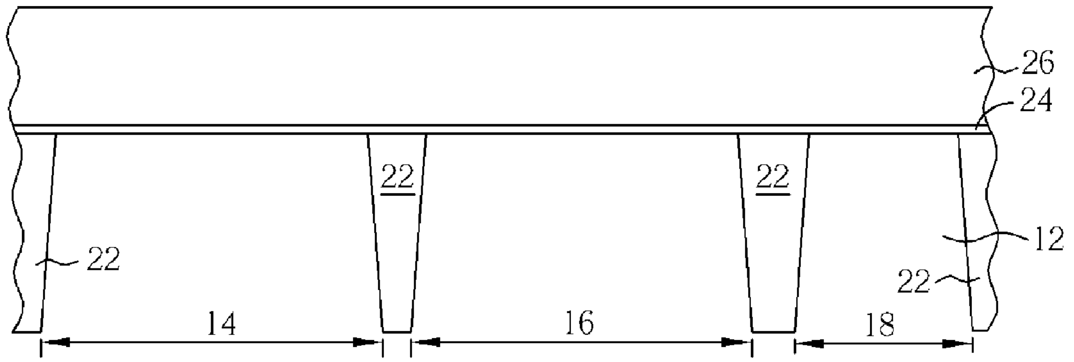
FIGS. 1-14 are perspective views illustrating a method for fabricating a device having metal gate transistors and a polysilicon resistor according to a preferred embodiment of the present invention.

Referring to FIGS. 1-14, FIGS. 1-14 are perspective views illustrating a method for fabricating a device having metal gate transistors and polysilicon resistor according to a preferred embodiment of the present invention. As shown in FIG. 1, a substrate 12 is first provided. The substrate 12 is preferably a silicon substrate or a silicon-on-insulator (SOI) substrate. A transistor region and a capacitor region 18 are defined in the substrate 12, and a plurality of shallow trench isolations 22 dividing the transistor region and the capacitor region 18 is also formed. In this embodiment, the transistor region includes a NMOS transistor region 14 and a PMOS transistor region 16.

A gate dielectric layer 24 composed of oxides is formed on the substrate 12, and a polysilicon layer 26 having a thickness of about 1000 angstroms is formed on the gate dielectric layer 24 thereafter. In this embodiment, the polysilicon layer 26 can be composed of undoped polysilicon or polysilicon having n+ dopants, which are all within the scope of the present invention.

Figure 2:
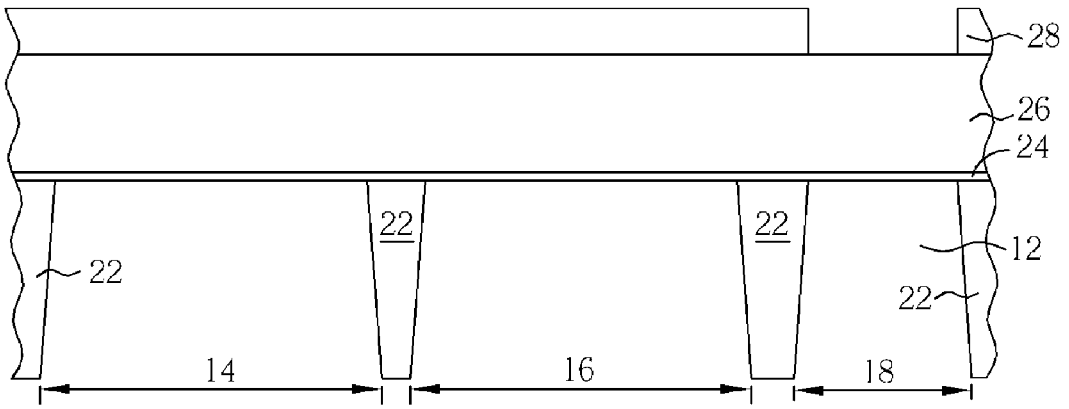

As shown in FIG. 2, a patterned photoresist 28 is formed on the polysilicon layer 26, and an etching process is performed by using the patterned photoresist 28 as a mask to remove a portion of the polysilicon layer 26 disposed on the resistor region 18. Preferably, the portion of the polysilicon layer 26 is removed by a dry etching process, and the removed portion of the polysilicon layer 26 is approximately 200 angstroms. Nevertheless, other etching process (such as wet etching) can also be applied to remove a portion of the polysilicon layer 26, and the thickness of the removed portion of the polysilicon layer 26 could also be adjusted, which are all within the scope of the present invention.

Figure 3:
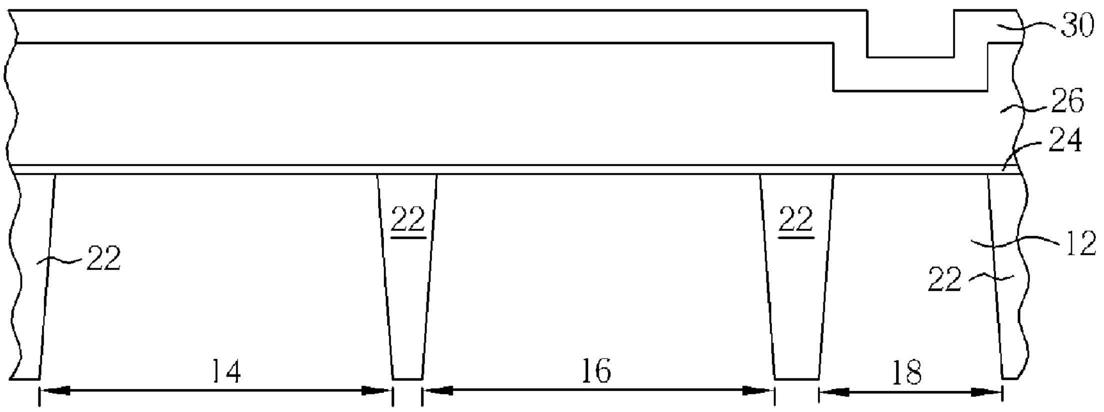

As shown in FIG. 3, the patterned photoresist 28 is removed, and a hardmask 30 is deposited on the polysilicon layer 26.

Figure 4:
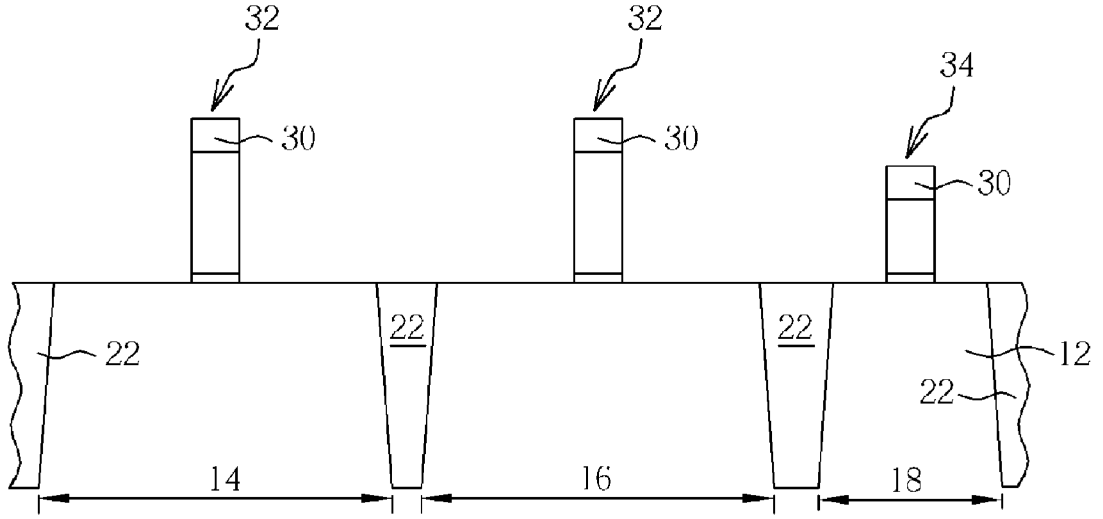

As shown in FIG. 4, another patterned photoresist (not shown) is formed on the hardmask 30, and another etching process is conducted by using the patterned photoresist as a mask to form a polysilicon gate 32 in each of the NMOS transistor region 14 and the PMOS transistor region 16, and a polysilicon resistor 34 in the resistor region 18. Preferably, the channel length of the polysilicon gate 32 in the NMOS transistor region 14 and the PMOS transistor region 16 is about 300 angstroms. It should also be noted that as a portion of the polysilicon layer 26 in the resistor region 18 is removed in the previous step, the resulting polysilicon resistor 34 would be lower in height than each of the polysilicon gates 32, thereby creating a step height difference between the two structures.

According to an embodiment of the present invention, a single etching process or a two stage etching process could be used to form the aforementioned polysilicon gates 32 and the polysilicon resistor 34. For instance, a patterned photoresist (not shown) can be formed on the hardmask 30, and an etching process is performed by using the patterned photoresist as a mask to remove a portion of both hardmask 30 and the polysilicon layer 26, thereby forming the polysilicon gates 32 and the polysilicon resistor 34 within a single step. Alternatively, after a patterned photoresist (not shown) is formed on the hardmask 30, an etching process can be performed by using the patterned photoresist as a mask to remove only a portion of the hardmask 30. After the patterned photoresist is removed, another etching process is conducted by using the remaining hardmask 30 as a mask to etch the portion of the polysilicon layer 26 not covered by the hardmask 30, thereby forming the aforementioned polysilicon gates 32 and the polysilicon resistor 34.

Figure 5:
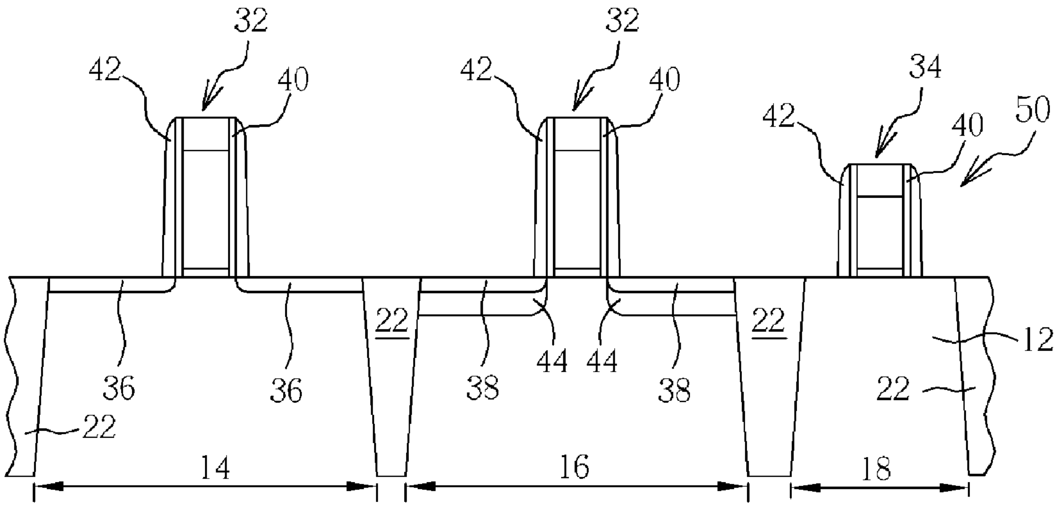

As shown in FIG. 5, a light doping process is performed to form a plurality of lightly doped drains in the NMOS transistor region 14 and the PMOS transistor region 16. For instance, a patterned photoresist (not shown) is formed on regions outside the NMOS transistor region 14, and an ion implantation is performed by using the patterned photoresist as a mask to implant n-type dopants into the substrate 12 surrounding the polysilicon gate 32 of the NMOS transistor region 14. This forms a lightly doped drain 36 in the NMOS transistor region 14. After the above patterned photoresist is stripped, another patterned photoresist is formed on regions outside the PMOS transistor region 16, and another ion implantation is conducted by using the patterned photoresist as a mask to implant p-type dopants into the substrate 12 surrounding the polysilicon gate 32 of the PMOS transistor region 16. This forms a lightly doped drain 38 in the PMOS transistor region 38.

Next, a first stage spacer formation is conducted by depositing a silicon nitride layer 42 and a silicon oxide layer 40 over the sidewall of the polysilicon gate 32 in the NMOS transistor region 14 and the PMOS transistor region 16, and the sidewall of the polysilicon resistor 34 in the resistor region 18.

A selective epitaxial growth (SEG) process is performed thereafter to form a strain silicon layer in the substrate 12 of the NMOS transistor region 14 or the PMOS transistor region 16. For instance, after two recess (not shown) are formed in the substrate 12 surrounding the polysilicon gate 32 of the PMOS transistor region 16, a SEG process is conducted to substantially fill the two recess with a silicon germanium layer 44. This silicon germanium layer 44 preferably provides a compressive strain to the channel region of the PMOS transistor region 16 and increases the hole transfer rate of the PMOS transistor.

Figure 6:
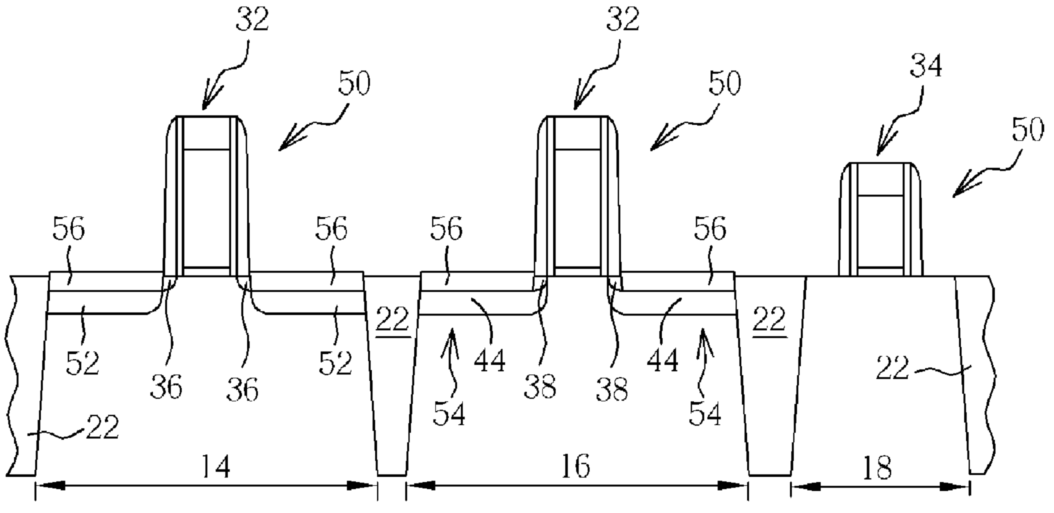

Next, as shown in FIG. 6, a series of heavily doped ion implantations are performed to form a source/drain region in each of the NMOS transistor region 14 and the PMOS transistor region 16. For instance, a patterned photoresist (not shown) is formed on regions outside the NMOS transistor region 14, and an ion implantation is conducted by using the patterned photoresist as a mask to implant n-type dopants into the substrate 12 surrounding the spacer 50 within the NMOS transistor region 14. This forms a source/drain region 52 in the NMOS transistor region 14. After stripping the patterned photoresist disposed on regions outside the NMOS transistor region 14, another patterned photoresist (not shown) is formed on regions outside the PMOS transistor region 16, and another ion implantation is conducted by using the patterned photoresist as a mask to implant p-type dopants into the substrate 12 surrounding the spacer 50 within the PMOS transistor region 16. This forms another source/drain region 54 in the PMOS transistor region 16.

After the formation of the source/drain regions 52, 54, a standard salicide process is conducted by forming a metal layer (not shown) composed of cobalt, titanium, platinum, palladium, or molybdenum over the surface of the substrate 12 and the spacer 50. A rapid thermal annealing process is then performed by using high temperature to transform the metal layer disposed on the substrate 12 into a silicide layer 56. The unreacted metal layer is removed thereafter.

Figure 7:
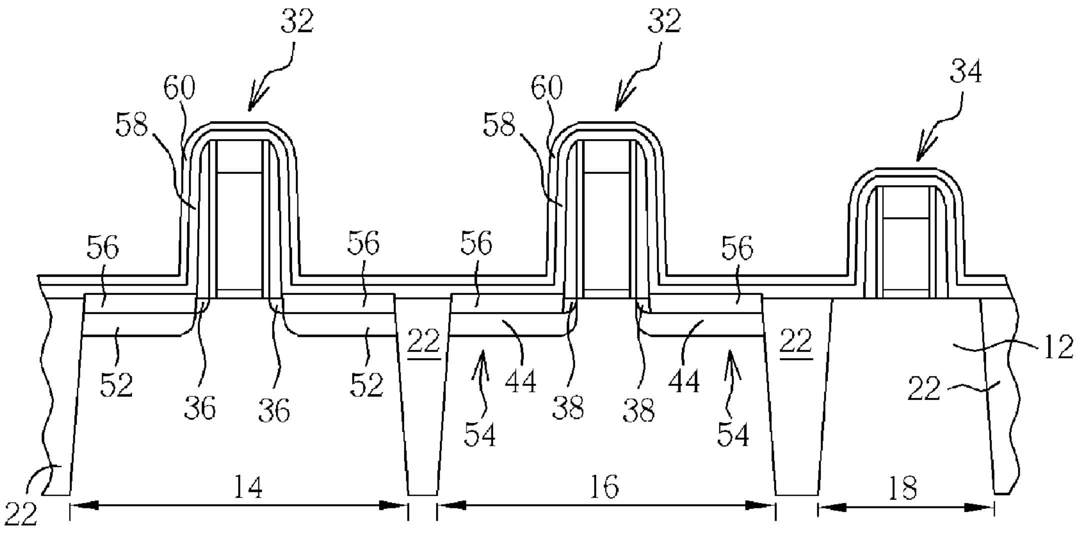

As shown in FIG. 7, a silicon oxide layer 58 and a silicon nitride layer 60 are deposited over the surface of the spacer 50 and the substrate 12. In this embodiment, the depth of the silicon oxide layer 58 is about 50 angstroms and the depth of the silicon nitride layer 60 is about 100 angstroms.

Figure 8:
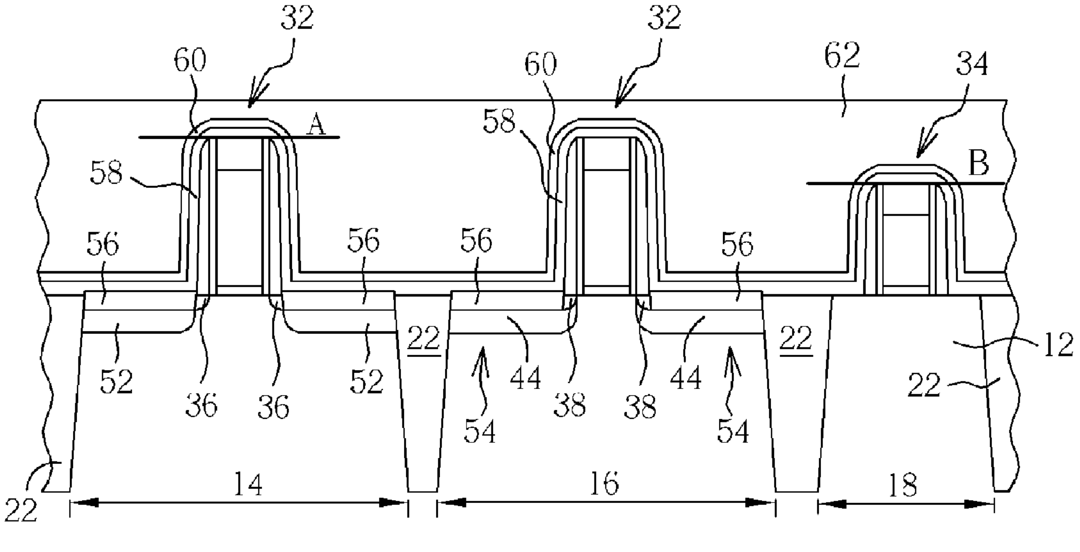

As shown in FIG. 8, an interlayer dielectric layer 62 composed of oxides is formed on the silicon nitride layer 60 to cover the NMOS transistor region 14, the PMOS transistor region 16, and the resistor region 18. A chemical mechanical polishing process or a dry etching process is performed thereafter to remove a portion of the interlayer dielectric layer 62.

According to the preferred embodiment of the present invention, the aforementioned chemical mechanical polishing process can be conducted by using the hardmask 30 of different region as a stop layer to stop the chemical mechanical polishing process at different heights, such as having the polishing to stop directly at height A, stop directly at height B, or stop at height A and then to height B. For instance, the chemical mechanical polishing process can be performed by using the hardmask 30 of the NMOS transistor region 14 and the PMOS transistor region 16 as a stop layer to remove a portion of the interlayer dielectric layer 62 and stop at the hardmask 30 of the transistor regions 14, 16 (such as height A). After the polishing process is completed, a metal gate formation process is performed to form metal gates in the transistor regions 14, 16.

According to another embodiment of the present invention, after the polishing is stopped at height A, another polishing is performed by using the hardmask 30 of the resistor region 18 as another stop layer to remove a portion of the interlayer dielectric layer 62 and a portion of the polysilicon gate 32 and spacer 50 of the NMOS transistor region 14 and the PMOS transistor region 16. This second polishing process would stop at the hardmask 30 of the resistor region 18 (such as height B).

Figure 9:
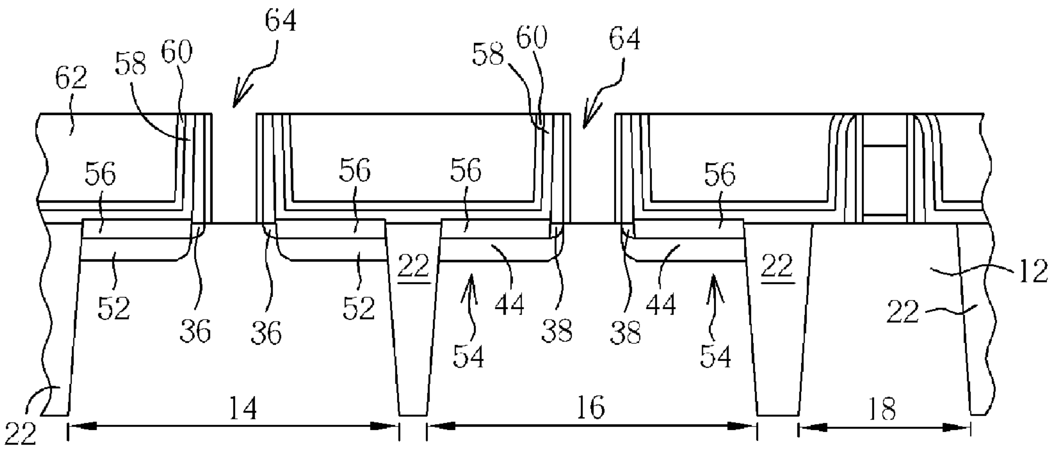

According to the third embodiment of the present invention, the chemical mechanical polishing process can be performed by using the hardmask 30 of the resistor region 18 directly as a stop layer to remove a portion of the polysilicon gate 32 and spacer 50 of the NMOS transistor region 14 and the PMOS transistor region 16 and stop at the hardmask 30 of the resistor region 18 (such as height B). As shown in FIG. 9, after the polishing process stops at height B and removes a portion of the polysilicon gates 32 and spacer 50 of the transistor regions, a patterned photoresist (not shown) is used as a mask to perform an etching process to remove the polysilicon gates 32 from the NMOS transistor region 14 and the PMOS transistor region 16 for forming an opening 64 in each transistor region.

Figure 10:
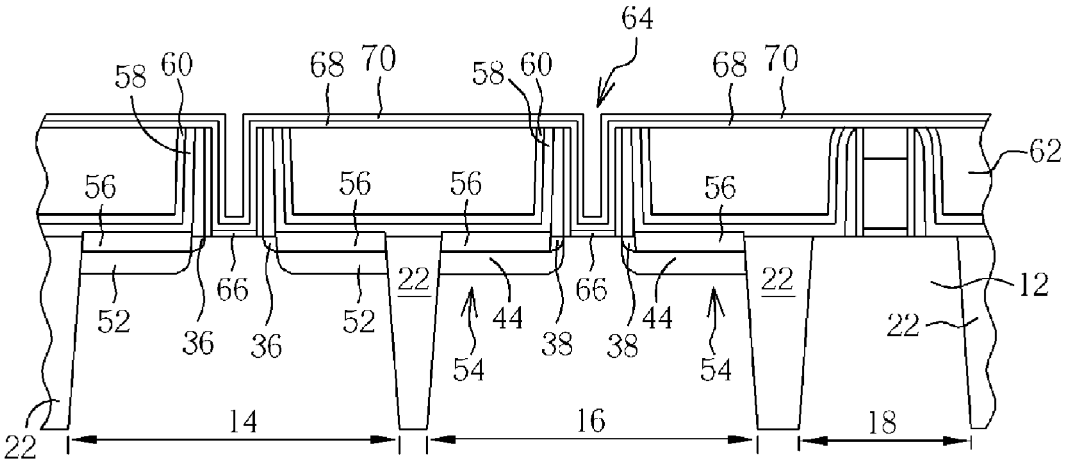

As shown in FIG. 10, an oxide layer 66 is deposited in the bottom of each opening 64, and a dielectric layer 68 composed high-k dielectric material and an n-type metal layer 70 are disposed sequentially over the surface of the oxide layer 66 and the interlayer dielectric layer 62.

Figure 11:
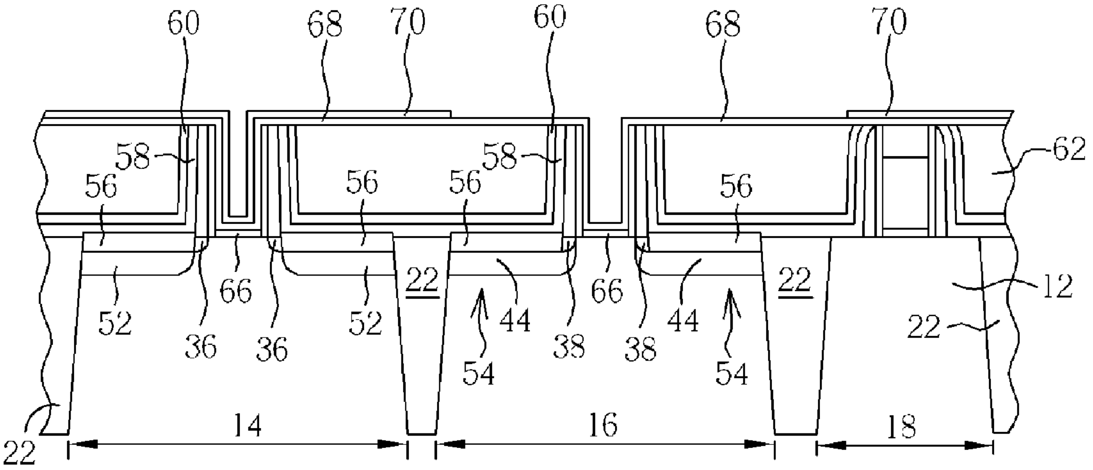

As shown in FIG. 11, a patterned photoresist (not shown) is formed on areas outside the PMOS transistor region 16, and an etching process is conducted by using the patterned photoresist as a mask to remove the n-type metal layer 70 disposed on the PMOS transistor region 16.

Figure 12:
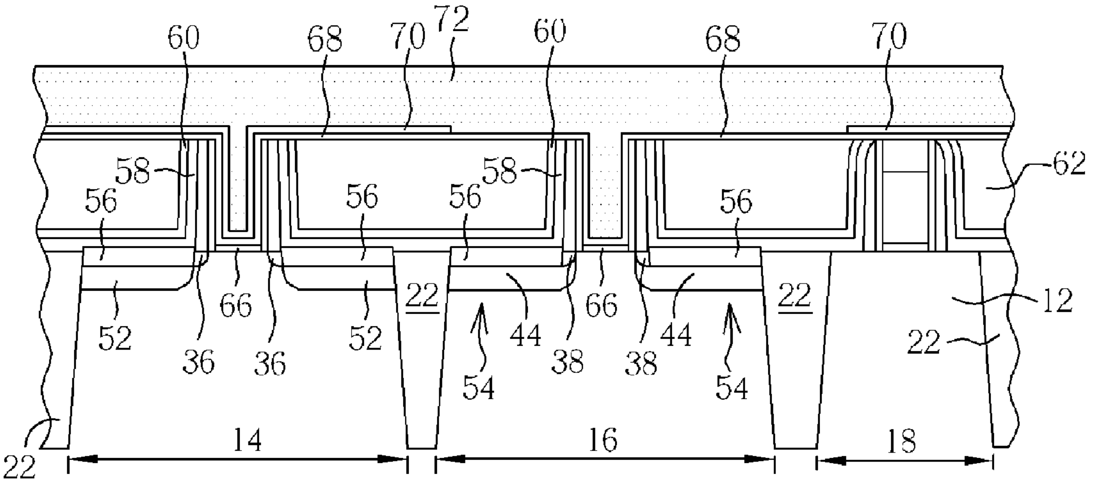

As shown in FIG. 12, a p-type metal layer 72 is disposed over the surface of the n-type metal layer 70 and filled into each opening 64.

Figure 13:
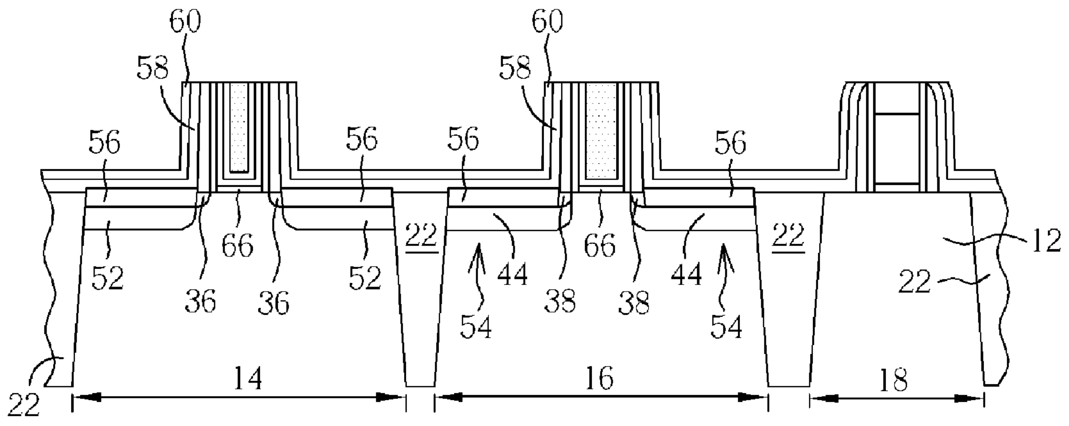

As shown in FIG. 13, another chemical mechanical polishing process is conducted by using the hardmask 30 of the resistor region 18 as a stop layer to remove a portion of the p-type metal layer 72, the n-type metal layer 70, dielectric layer 68, and top of the spacer 50.

Figure 14:
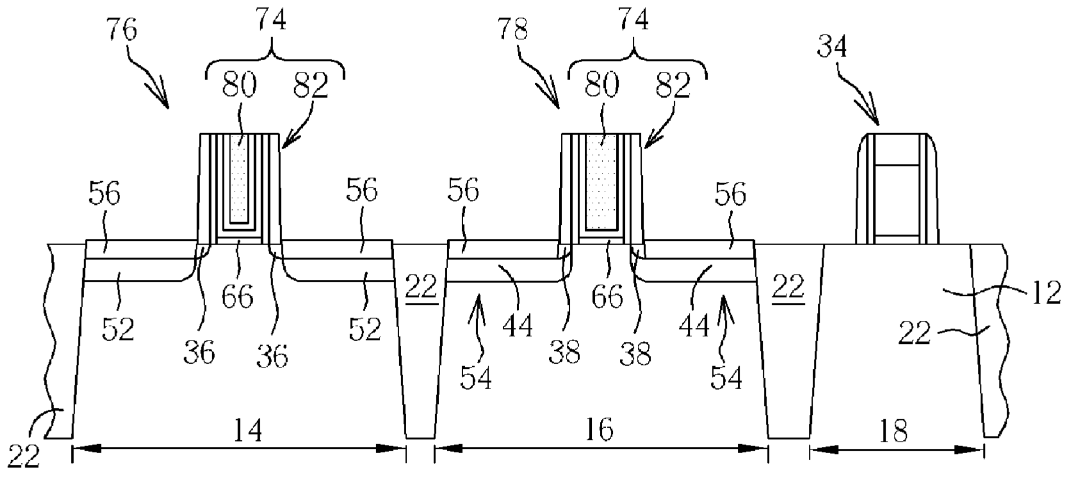

As shown in FIG. 14, after removing the silicon nitride layer 60 and the silicon oxide layer 58, a NMOS transistor 76 and a PMOS transistor 78 are formed in the NMOS transistor region 14 and the PMOS transistor region 16 respectively, in which each of the NMOS transistor 76 and the PMOS transistor 78 includes a truncated metal gate structure 74. Each of the truncated metal gate structure 74 has a truncated metal gate 80 and a truncated spacer 82. Preferably, after the chemical mechanical polishing process performed previously, the top of the truncated spacer 82 is substantially even with the top of the truncated metal gate 80, and the top of the polysilicon resistor 34 is also substantially even with top of each truncated metal gate structure 74.

Figure 15:
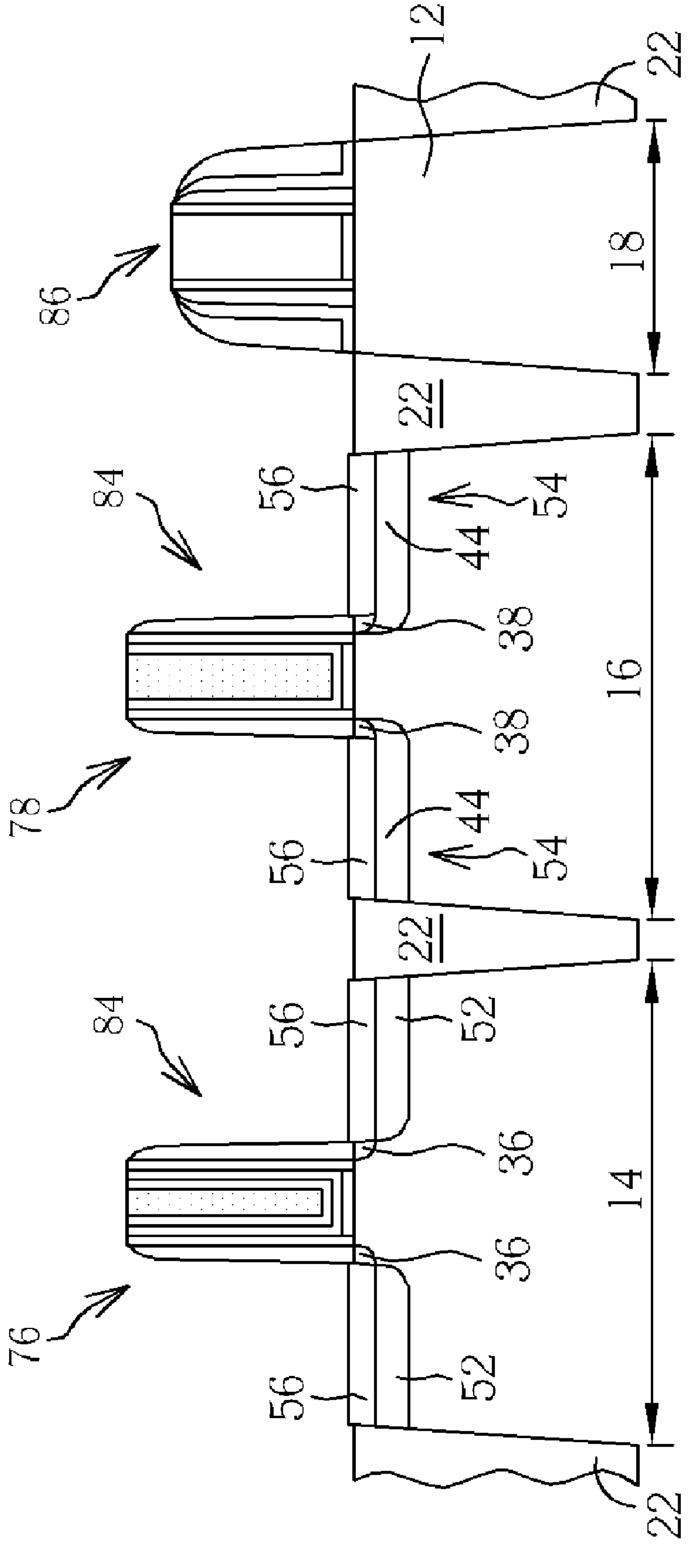
FIG. 15 illustrates a structural view of a semiconductor having metal gate transistors and a polysilicon resistor according to an embodiment of the present invention.

According to another embodiment of the present invention, as shown in FIG. 15, after the polishing process shown in FIG. 8 stops at height A, a metal gate formation process is conducted thereafter to form another semiconductor device having metal gate transistor and polysilicon resistor. For instance, after the polishing process stops at height A, the hardmasks 30 of the NMOS transistor region 14 and the PMOS transistor region 16 are stripped, and the aforementioned process for forming metal gates is applied to deposit dielectric layer, n-type metal layer, and p-type metal layer to form another structure having a plurality of metal gate structures 84 and a polysilicon resistor 86. As shown in FIG. 15, as the metal gate structures 84 within the NMOS transistor region 14 and the PMOS transistor region 16 are not partially removed during the chemical mechanical polishing process, the resulting height of the polysilicon resistor 86 would be less than the height of the metal gate structures 84 of the transistor regions.

Overall, the present invention uses an etching process to remove a portion of the polysilicon layer within the resistor region, such that the surface of the polysilicon layer of the resistor region would be lower than the surface of the polysilicon layer of the surrounding transistor region. Next, a hardmask is formed over the surface of the polysilicon layer. As the height of the polysilicon layer in the resistor region is lower than the height of the polysilicon layer in the transistor region after the etching process, the polysilicon resistor fabricated thereafter would also be lower in height than the transistors in the transistor region. As a result, the hardmask disposed on the polysilicon resistor could be used as a stop layer to stop the later chemical mechanical polishing process on the surface of the polysilicon resistor, and the metal gate fabrication is conducted thereafter. By using this approach, the present invention could successfully fabricate a semiconductor device having both metal gate transistors and polysilicon resistor.

Those skilled in the art will readily observe that numerous modifications and alterations of the device and method may be made while retaining the teachings of the invention.

What is claimed is:

1. A method for fabricating metal gate transistors and a polysilicon resistor, comprising:

providing a substrate having a transistor region and a resistor region;

forming a polysilicon layer on the substrate to cover the transistor region and the resistor region;

removing a portion of the polysilicon layer disposed in the resistor region;

patterning the polysilicon layer for creating a step height between the surface of the polysilicon layer disposed in the transistor region and the surface of the polysilicon layer disposed in the resistor region;

forming at least one polysilicon gate in the transistor region and one polysilicon resistor in the resistor region; and forming the polysilicon gate into a metal gate transistor.

2. The method for fabricating metal gate transistors and a polysilicon resistor of claim 1, wherein the step of forming at least one polysilicon gate in the transistor region and one polysilicon resistor in the resistor region further comprises:

forming a hardmask on the polysilicon layer after removing the portion of the polysilicon layer disposed in the resistor region;

patterning the hardmask and the polysilicon layer to form a first polysilicon gate and a second polysilicon gate in the transistor region and the polysilicon resistor in the resistor region;

forming a lightly doped drain in the substrate surrounding the first polysilicon gate and the second polysilicon gate;

forming a spacer on the sidewall of each of the first polysilicon gate, the second polysilicon gate, and the polysilicon resistor;

forming a source/drain region in the substrate surrounding the spacer disposed in the transistor region;

performing a salicide process to form a silicide layer on the surface of the substrate surrounding the spacer disposed in the transistor region;

forming an interlayer dielectric layer on the transistor region and the resistor region;

performing a first removal process to remove a portion of the interlayer dielectric layer and expose the hardmask.

3. The method for fabricating metal gate transistors and a polysilicon resistor of claim 2, wherein the step of forming the polysilicon gate into the metal gate transistor further comprises:

removing the first polysilicon gate and the second polysilicon gate to form a first opening and a second opening in the interlayer dielectric layer;

depositing a first metal layer in the first opening and the second opening;

removing the first metal layer from the second opening;

filling the first opening and the second opening with a second metal layer; and performing a second removal process to remove a portion of the first metal layer and the second metal layer for forming a first metal gate transistor and a second metal gate transistor in the transistor region.

4. The method for fabricating metal gate transistors and a polysilicon resistor of claim 2, wherein the first metal gate transistor is a NMOS transistor and the second metal gate transistor is a PMOS transistor.

5. The method for fabricating metal gate transistors and a polysilicon resistor of claim 4, further comprising forming a silicon germanium layer in the substrate surrounding the gate before forming the spacer.

6. The method for fabricating metal gate transistors and a polysilicon resistor of claim 2, wherein the first removal process is performed until reaching the surface of the hardmask of the transistor region.

7. The method for fabricating metal gate transistors and a polysilicon resistor of claim 2, wherein the first removal process is performed until reaching the surface of the hardmask of the resistor region, wherein the first removal process comprises a chemical mechanical polishing process or an etching process.

8. The method for fabricating metal gate transistors and a polysilicon resistor of claim 7, wherein the first removal process further comprises:

removing a portion of the interlayer dielectric layer until reaching the surface of the hardmask of the transistor region; and using the hardmask of the resistor region as a stop layer to remove a portion of the first polysilicon gate, a portion of the second polysilicon gate, and a portion of the spacer until reaching the surface of the hardmask of the resistor region.

9. The method for fabricating metal gate transistors and a polysilicon resistor of claim 8 further comprising utilizing an etching process or a chemical mechanical polishing process to remove the interlayer dielectric layer, the first polysilicon gate, and the second polysilicon gate.

10. A semiconductor device having metal gate transistor and polysilicon resistor, comprising:

a substrate having a transistor region and a resistor region;

a transistor disposed in the transistor region, wherein the transistor comprises at least a metal gate structure; and a polysilicon resistor structure disposed in the resistor region, wherein the height of the polysilicon resistor structure is less than the height of the metal gate structure.

11. The semiconductor device having metal gate transistor and polysilicon resistor of claim 10, wherein the metal gate structure further comprises:

a metal gate disposed in the transistor region; and a first spacer disposed around the sidewall of the metal gate.

12. The semiconductor device having metal gate transistor and polysilicon resistor of claim 10, wherein the transistor is a NMOS transistor or a PMOS transistor.

13. The semiconductor device having metal gate transistor and polysilicon resistor of claim 12, further comprising a silicon germanium layer disposed in the substrate surrounding the metal gate structure of the PMOS transistor.

14. The semiconductor device having metal gate transistor and polysilicon resistor of claim 10, further comprising a silicide layer disposed in the substrate surrounding the metal gate structure.

15. The semiconductor device having metal gate transistor and polysilicon resistor of claim 10, further comprising an interlayer dielectric layer disposed on the transistor and the polysilicon resistor structure.

16. The semiconductor device having metal gate transistor and polysilicon resistor of claim 10, wherein the polysilicon resistor structure further comprises:

a polysilicon resistor, disposed in the resistor region; and a second spacer disposed around the sidewall of the polysilicon resistor.

17. A semiconductor device having metal gate transistor and polysilicon resistor, comprising:

a substrate having a transistor region and a resistor region;

a transistor disposed in the transistor region, wherein the transistor comprises at least a truncated metal gate structure; and a polysilicon resistor structure disposed in the resistor region, wherein the top of the polysilicon resistor structure is even with the top of the truncated metal gate structure.

18. The semiconductor device having metal gate transistor and polysilicon resistor of claim 17, wherein the truncated metal gate structure further comprises:

a truncated metal gate; and a truncated spacer disposed around the sidewall of the truncated metal gate, wherein the top of the truncated spacer is even with the top of the truncated metal gate.

19. The semiconductor device having metal gate transistor and polysilicon resistor of claim 17, wherein the polysilicon resistor structure further comprises:

a polysilicon resistor, disposed in the resistor region; and a spacer disposed around the sidewall of the polysilicon resistor.

* * * * *